United States Patent
Serventi et al.

(10) Patent No.: US 8,669,805 B2
(45) Date of Patent: Mar. 11, 2014

(54) COUPLING CIRCUIT, DRIVER CIRCUIT AND METHOD FOR CONTROLLING A COUPLING CIRCUIT

(75) Inventors: Riccardo Serventi, Viareggio (IT); Luigi Di Piro, Ponsacco (IT); Monica Schipani, Pisa (IT); Paolo D'Abramo, Civitavecchia (IT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 13/393,832

(22) PCT Filed: Aug. 27, 2010

(86) PCT No.: PCT/EP2010/062588
§ 371 (c)(1), (2), (4) Date: May 29, 2012

(87) PCT Pub. No.: WO2011/026799
PCT Pub. Date: Mar. 10, 2011

(65) Prior Publication Data
US 2012/0229175 A1 Sep. 13, 2012

(30) Foreign Application Priority Data
Sep. 3, 2009 (EP) .................................. 09011320

(51) Int. Cl.
*H03K 17/687* (2006.01)
(52) U.S. Cl.
USPC ............ 327/434; 327/388; 327/427; 327/387
(58) Field of Classification Search
USPC .................................. 327/434, 427, 388, 387
See application file for complete search history.

(56) References Cited

U.S. PATENT DOCUMENTS

| | | | |
|---|---|---|---|
| 5,880,620 A * | 3/1999 | Gitlin et al. ................... | 327/534 |
| 5,963,080 A | 10/1999 | Miske et al. | |
| 6,020,778 A * | 2/2000 | Shigehara et al. ............ | 327/534 |
| 6,281,737 B1 * | 8/2001 | Kuang et al. .................. | 327/382 |
| 6,320,408 B1 | 11/2001 | Kwong | |
| 6,335,653 B1 * | 1/2002 | Shigehara et al. ............ | 327/534 |
| 7,095,266 B2 * | 8/2006 | Miske ............................ | 327/427 |
| 7,224,206 B2 * | 5/2007 | Pappalardo et al. .......... | 327/536 |
| 7,576,593 B2 * | 8/2009 | Chang et al. .................. | 327/536 |
| 7,724,069 B1 * | 5/2010 | Webb ............................ | 327/534 |
| 7,728,649 B1 * | 6/2010 | Webb et al. ................... | 327/534 |
| 8,283,968 B2 * | 10/2012 | Ramet ........................... | 327/391 |
| 8,344,789 B2 * | 1/2013 | Webb ............................ | 327/534 |
| 2005/0195015 A1 * | 9/2005 | Goldman ....................... | 327/391 |
| 2006/0044019 A1 | 3/2006 | Graves | |

* cited by examiner

*Primary Examiner* — Ryan Jager
(74) *Attorney, Agent, or Firm* — McDermott Will & Emery LLP

(57) ABSTRACT

A coupling circuit has a first and a second transistor (P1, P2) of a p-channel field-effect transistor type. A drain terminal of the first transistor (P1) is connected to a signal input (1), source terminals of the first and the second transistor (P1, P2) are commonly connected to a signal output (2), bulk terminals of the first and the second transistor (P1, P2) are commonly connected to a drain terminal of the second transistor (P2), and a gate terminal of the first transistor (P1) is connected to a gate terminal of the second transistor (P2). The coupling circuit further comprises a gate control circuit (10) with a charge pump circuit (110) which is configured to generate a negative potential. The gate control circuit (10) is configured to control a gate voltage at the gate terminals of the first and the second transistor (P1, P2) based on a negative potential.

13 Claims, 2 Drawing Sheets

COUPLING CIRCUIT, DRIVER CIRCUIT AND METHOD FOR CONTROLLING A COUPLING CIRCUIT

RELATED APPLICATIONS

This is a U.S. national stage of application No. PCT/EP2010/062588, filed on Aug. 27, 2010. This application claims the priority of European application no. 09011320.0 filed Sep. 3, 2009, the entire content of which is hereby incorporated by reference.

FIELD OF THE INVENTION

The invention relates to a coupling circuit, to a driver circuit comprising such a coupling circuit and to a method for controlling a coupling circuit.

BACKGROUND OF THE INVENTION

Output drivers are used to control a voltage at an output terminal. For example, transistors are used which couple the output terminal to a ground potential terminal and which are controlled by a respective driver control circuit. Based on the control, preferably either a high potential or a low potential is present at the output terminal.

Problems can arise when negative voltages are present at the output terminal. For example, in a CMOS process, when an analogue output driver with an NMOS transistor is used, a parasitic diode between drain and substrate of the transistor becomes forward biased if the output voltage falls below −0.3 Volt with respect to the ground potential. However, if a voltage output low level smaller than 1 Volt is required, an NMOS transistor is preferably used because of the low voltage drop in its conducting state. Therefore, to withstand negative voltages at the output terminal, a diode can be connected between the output terminal and the NMOS transistor. However, the voltage drop across the diode increases the voltage output low level.

SUMMARY OF THE INVENTION

It is an object of the invention to provide a coupling circuit and a method for controlling a coupling circuit which make it possible to achieve a low voltage output low level and a protection against negative voltages at the output terminal. It is a further object of the invention to provide a driver circuit with such a coupling circuit.

An embodiment of a coupling circuit comprises a signal input, a signal output and a first and a second transistor which each are of a p-channel field-effect transistor type. Preferably the first and the second transistor are PMOS transistors. A drain terminal of the first transistor is connected to the signal input. Source terminals of the first and the second transistor are commonly connected to the signal output. bulk terminals of the first and the second transistor are commonly connected to a drain terminal of the second transistor. A gate terminal of the first transistor is connected to a gate terminal of the second transistor. The coupling circuit further comprises a gate control circuit with a charge pump circuit which is configured to generate a negative potential. The gate control circuit is configured to control a gate voltage at the gate terminals of the first and the second transistor based on the negative potential.

The first and the second transistor are connected such that the first transistor forms a current path from the signal input to the signal output. Furthermore, the second transistor connects the bulk terminal of the first transistor to its source terminal preventing a current flow from the source terminal to the bulk terminal of the first transistor over a parasitic diode between these terminals. The gate voltage at the gate terminals of the first and the second transistor are derived from the negative potential generated by the charge pump circuits. Hence, a low source to drain voltage across the first transistor is achieved, making a low voltage output low level possible for a driver transistor connected to the signal input.

In one embodiment the gate control circuit further comprises a limitation circuit which is configured to control the gate voltage depending on a potential at the signal input such that a potential difference between the gate voltage and the potential at the signal input does not exceed a predetermined value. Hence, in this embodiment, when the voltage at the signal output rises from a normal operating point, for example due to an overvoltage at the signal output, the gate voltage of the first and the second transistor will follow the voltage at the source terminal of the first transistor as will do the drain terminal of the first transistor. As a consequence, the gate to source voltage of the first transistor will not exceed a predetermined value. The first and the second transistor are protected from overvoltage damage by this measure. Furthermore, this measure can limit a current through the first transistor.

For example, the limitation circuit comprises at least one diode element whose anode terminal is connected to the signal input and whose cathode terminal is connected to the gate terminals of the first and the second transistor. Preferably, a series connection of two diode elements is connected between the signal input and the gate terminals, resulting in a voltage difference between gate terminal and drain terminal of the first transistor being approximately twice a forward bias voltage of the diode elements.

In one embodiment the gate control circuit further comprises a separation circuit which is configured to actuate the first and the second transistor to a non-conducting state if a potential at the signal output falls below a reference potential. Hence, when a negative voltage is present at the signal output, the first and the second transistor are actively turned off to prevent a current flow from the signal output to the signal input which could damage the circuit connected to the signal input.

For example, the separation circuit comprises a switching element connecting the gate terminals of the first and the second transistor to a reference potential terminal and comprises a sensing circuit for controlling the switching element depending on the potential at the signal output. If the sensing circuit detects a negative voltage, that means a voltage below the potential at the reference potential terminal, the gate terminals of the first and the second transistor are actively connected to the reference potential terminal. Hence, the first and the second transistor are actively turned off.

In one embodiment, the switching element comprises a transistor which is connected to a transistor of the sensing circuit in a current mirror fashion. The transistor of the sensing circuit is connected to the signal output via a first resistive element. Hence, if a current flow is generated through the first resistive element and the transistor of the sensing circuit, this current is mirrored to the other transistor, hence, drawing the potential at the gate terminals of the first and the second transistor to the reference potential.

In one embodiment the charge pump circuit comprises a clock input for receiving a clock signal. A first charge store is connected between the clock input and a connection terminal. The charge pump circuit further comprises a first diode element whose anode terminal is connected to the connection terminal and whose cathode terminal is connected to a reference potential terminal. A second charge store is connected between the reference potential terminal and an output terminal of the charge pump circuit for providing the negative potential. A second diode element has an anode terminal which is connected to the output terminal and a cathode terminal which is connected to the connection terminal.

Preferably, the clock signal is provided to the clock input via a buffer stage which may be formed by one or more inverters. The charge pump circuit is driven by the voltage difference between the low state and the high state of the clock signal.

In a first clock period, the first charge store is charged via the first diode element to said voltage difference. In a second clock period the charge from the first charge store is transferred to the second charge store via the second diode element, resulting in the negative potential at the output terminal of the charge pump circuit. First and second clock period alternate with the clock signal.

One embodiment the output terminal of the charge pump circuit is connected to the gate terminals of the first and the second transistor via a second resistive element. Preferably, the second resistive element is high ohmic. Therefore, basically no current can flow into the charge pump circuit from the gate terminals which may for example be provided by the limitation circuit.

In an embodiment of a method for controlling a coupling circuit, a first and the second transistor, each of a p-channel field-effect transistor type are provided. Herein a drain terminal of the first transistor is connected to a signal input, source terminals of the first and the second transistor are commonly connected to a signal output, bulk terminals of the first and the second transistor are commonly connected to a drain terminal of the second transistor, and a gate terminal of the first transistor is connected to a gate terminal of the second transistor. A negative potential is generated and a gate voltage at the gate terminals of the first and the second transistor is controlled based on the negative potential.

The controlling of the gate voltage based on the negative potential ensures a low resistance between source and drain terminals of the first transistor. Hence, a low voltage drop across the first transistor occurs during normal operation, making a low voltage output low level possible.

In one embodiment, the gate voltage is controlled depending on a potential at the signal input such that a potential difference between the gate voltage and the potential at the signal input such that a potential difference between the gate voltage and the potential at the signal input does not exceed a predetermined value. Hence, the first and the second transistor are protected against overvoltages. Furthermore, a current flow through the first and the second transistor may be limited, avoiding damage of these elements and elements connected to the signal input.

In one embodiment a potential at the signal output is sensed and the first and the second transistor are actuated to a non-conducting state if the sensed potential falls below a reference potential. Hence, if a negative potential occurs at the signal output, the first and the second transistor are actively turned off thus preventing a current flow through these elements. For example, the gate terminals of the first and the second transistor are connected to a reference potential terminal in a controlled fashion depending on a sensed potential.

In one embodiment, the negative potential is generated with a charge pump circuit.

An embodiment of a driver circuit comprises a coupling circuit according to one of the previously described embodiments, a driver transistor connected to the signal input of the coupling circuit, and a driver control circuit configured to control the driver transistor. Preferably, the driver transistor is an n-channel field-effect transistor or, in particular, an NMOS transistor configured for high voltage operation. The driver control circuit may be configured to perform a current limitation of a current through the driver transistor.

The conducting path of the driver transistor is connected in series to the conducting path of the first transistor. Thus, during normal operation, the first transistor acts as a small series resistance of the driver transistor, allowing a low voltage output low level.

DETAILED DESCRIPTION OF THE DRAWINGS

Figure 1:
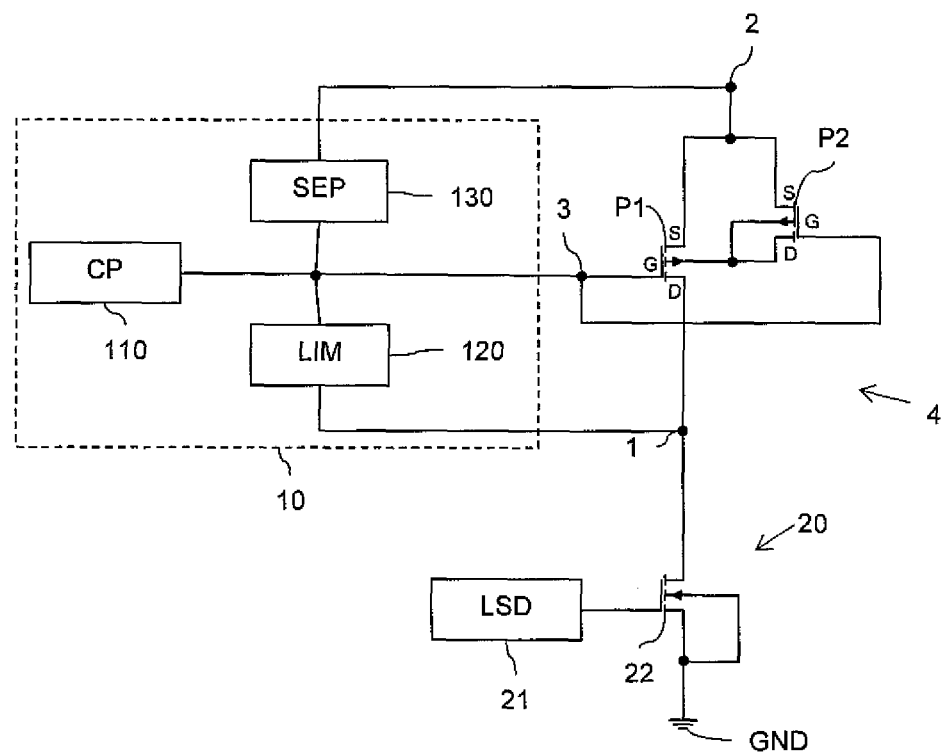
FIG. 1 is an embodiment of a driver circuit with a coupling circuit.

FIG. 1 shows an embodiment of a driver circuit with a driver stage 20 and a coupling circuit 4, which comprises a first and a second transistor P1, P2 and a gate control circuit 10. The driver stage 20 comprises a driver transistor 22 whose drain connection is connected to a signal input 1 of the coupling circuit 4 and whose source terminal is connected to a reference potential terminal GND. The bulk terminal of the driver transistor 22 is connected to its source terminal. A driver control circuit 21 which for example is a low-side driver is connected to the gate terminal of the driver transistor 22. Preferably, driver transistor 22 is designed for high voltage operation.

The first and the second transistor P1, P2 are shown as PMOS transistors but could be replaced by other p-channel field-effect transistors. Source terminals of the first and the second transistor P1, P2 are commonly connected to a signal output 2 of the coupling circuit 4. A drain terminal of the first transistor P1 is connected to the signal input 1. Bulk terminals of the first and the second transistor P1, P2 are connected to the drain terminal of the second transistor P2. Gate terminals of the first and the second transistor P1, P2 are commonly connected to a control input 3. Furthermore, a gate control circuit 10 is connected to the control terminal 3. The gate control circuit comprises a charge pump circuit 110, a limitation circuit 120 and a separation circuit 130 which each are connected to the control terminal 3 on their output side. The limitation circuit 120 is further connected to the signal input 1. The separation circuit 130 is further connected to the signal output 2.

The charge pump circuit 110 is configured to generate a negative potential which can be provided to the control terminal 3. The limitation circuit 120 is configured to control the gate voltage at the control terminal 3 depending on a potential at the signal input 1 such that a potential difference between the gate voltage and the potential at the signal input 1 does not exceed a predetermined value. The separation circuit 130 is configured to actuate the first and the second transistor to a non-conducting state if a potential at the signal output 2 falls below a reference potential, for example the potential at the reference potential terminal GND.

During normal operation the charge pump circuit 110 provides the negative potential to the control terminal 3 such that both the first and the second transistor P1, P2 are working in triode region or linear region of the transistors P1, P2. As a consequence, the bulk terminal of the first transistor P1 is actively connected to its source terminal by means of the fully conducting second transistor P2. This results in a low resistance of the first transistor P1 and therefore in a low voltage drop across the first transistor P1. Hence, the output voltage at the signal input 1 for low level signal generated by the driver stage 20 is only slightly increased.

Therefore, a low voltage output low level can be achieved with the driver circuit shown in FIG. 1.

The limitation circuit 120 additionally ensures that a voltage difference between the control terminal 3 and the signal input 1 does not exceed a predetermined value. Furthermore, the limitation circuit supports the operation of the first transistor P1 in its triode region.

If there is a negative voltage on the output terminal 2, for example due to a short circuit, the separation circuit 130 can sense this condition and actively turn off the first and the second transistor P1, P2 if the negative voltage is sensed. Hence, no current can flow out of the signal output 2 into the driver stage 20, thus preventing damage of the driver stage 20.

If there is an overvoltage on the signal output 2, the limitation circuit 120 ensures that the gate voltage at the control terminal 3 will follow any transient voltages on the signal output 2 due to the voltage dependencies between gate and drain and between source and drain of the first transistor P1. Hence, damage of the first and the second transistor P1, P2 because of the overvoltage is prevented.

If the circuit is unpowered, that means no supply voltage is present but the reference potential terminal GND and the signal output 2 are connected, the gate control circuit passively reacts to a negative or a positive voltage on the signal output 2. Thus, the driver stage 20 is also protected in this mode of operation.

Figure 2:
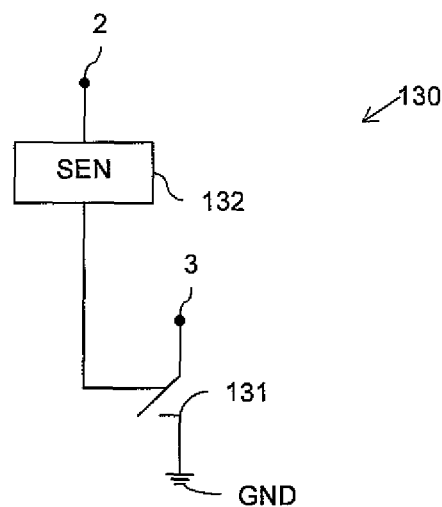
FIG. 2 is an embodiment of a separation circuit.

FIG. 2 shows an embodiment of a separation circuit 130 which could be employed in the gate control circuit 110 shown in FIG. 1. The separation circuit 130 comprises a sensing circuit 132 which is connected to the signal output 2 and to a control connection of a switching element 131. The switching element 131 connects the control terminal 3 to the reference potential terminal GND.

If the sensing circuit 132 detects a negative voltage at the signal output 2, then the switching element 131 is brought to a closed state such that the control terminal 3 is directly connected to the reference potential terminal GND. Based on the reference potential at the reference potential terminal GND, the first and the second transistor P1, P2 are actively turned off.

Figure 3:
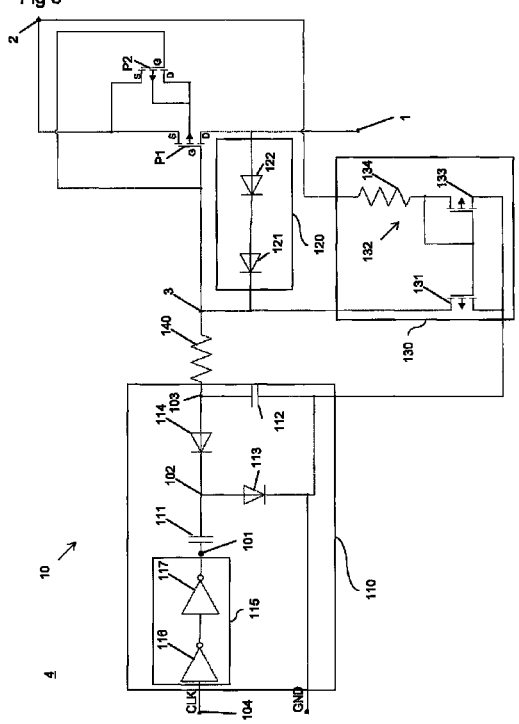
FIG. 3 is an embodiment of the coupling circuit.

FIG. 3 shows a more detailed embodiment of a coupling circuit 4 which could be used in full or in parts in the driver circuit shown in FIG. 1. Same reference numbers designate same elements. Their function will therefore not be fully explained again. Accordingly, the connections of the first and the second transistor P1, P2 are equivalent to the embodiments shown in FIG. 1. The limitation circuit 120 comprises a first and a second diode element 121, 122 which are connected in series. The forward direction of both diode elements 121, 122 connects the signal input 1 to the control terminal 3 such that no current can flow from the control terminal 3 to the signal input 1.

The separation circuit 130 comprises a PMOS transistor 131 acting as a controllable switching element and connecting the control terminal 3 to the reference potential terminal GND. The separation circuit 130 further comprises a first resistive element 134 and a second PMOS transistor 133 which are connected in series. Said series connection forms the sensing circuit 132 and connects the signal output 2 to the reference potential terminal GND. The source terminal of the transistor 133 is commonly connected to the gate terminals of the transistors 131, 133, thus forming a current mirror structure which is controlled by the current through the sensing circuit 132.

The charge pump circuit 110 comprises a buffer stage 115 coupled to a first input 104 for receiving a clock signal CLK. The buffer stage 115 comprises a series connection of two inverters 116, 117 whose output is connected to a first clock input 101 of the charge pump circuit 110. A first charge store 111 connects the clock input 101 to a connection terminal 102. A first diode element 113 connects the connection terminal 102 to the reference potential terminal GND, wherein an anode terminal is connected to the connection terminal and a cathode terminal is connected to the reference potential terminal GND. The charge pump circuit 110 further comprises a second diode element 114 whose anode terminal is connected to an output terminal 103 and whose cathode terminal is connected to the connection terminal 102. A second charge store 112 connects the output terminal 103 to the reference potential terminal GND. For example, the first and the second charge store 111, 112 are capacitors. The output terminal 103 is connected to the control terminal 3 via a second resistive element 140.

A driver stage can be connected to the signal input 1, for example like shown in FIG. 1.

During operation of the coupling circuit, a clock signal having two clock phases is provided to the charge pump circuit 110. During one phase, the clock signal at the clock input 101 has a positive voltage with respect to the reference potential, for example 3.3 Volt commonly used in CMOS circuits. During the other phase the clock signal CLK is equal to the reference potential. Hence, during the first phase, the first charge store 111 is charged with the positive voltage of the clock signal CLK via the first diode element 113. Hence, a voltage is stored on the first charge store 111 approximately being the positive voltage reduced by the forward voltage of the diode element 113. During the second phase of the clock signal CLK the clock input 101 is at the reference potential such that the voltage at the connection terminal 102 is below the reference potential by the voltage stored on the first charge store 111. Hence, the second charge store 112 is charged from the reference potential via the second diode element 114 to said voltage at the connection terminal 102 reduced by the forward voltage of the second diode element 114. As a consequence, a voltage is stored on the second charge store 112 being negative in view of a potential difference at the output terminal 103 and the reference potential terminal GND with a value being approximately the positive voltage of the clock signal CLK reduced by the respective forward voltages of the first and the second diode element 113, 114.

During operation, that negative potential is provided to the control terminal 3 via the second resistive element 140. At the second resistive element 140 preferably is high ohmic, little voltage drop will occur over the resistive element 140.

The limitation circuit 120 ensures that the voltage at the drain terminal of the first transistor P1 cannot be less at the voltage at the control terminal 3. During normal operation, the gate voltage at the control terminal 3 will be the drain voltage of the first transistor P1 reduced by the forward voltages of the diode elements 121, 122. The diode elements 121, 122 could be replaced by more or less diode elements connected in series, thus determining the maximum voltage difference between the gate voltage and the drain voltage of the first transistor P1.

During normal operation, the negative potential generated by the charge pump circuit 110 will actuate the first and the second transistor P1, P2 to a conducting state such that the first transistor P1 acts as a small series resistance between the signal input 1 and the signal output 2.

During positive transients or overvoltages at the signal output 2, the drain voltage of the first transistor P1 will follow the voltage at the signal output 2 because of the source/drain voltage given by the gate voltage at the control terminal 3. Because of the limitation circuit 120, the gate voltage 3 will also increase or, in other words follow the transient overvoltage at the signal output 2. Nevertheless, the first and the second transistor P1, P2 will stay in a conductive state without letting a current through the first and the second transistor P1, P2 becoming too large. Thus, as well the first and the second transistor as circuit connected to the signal input 1 are protected against overvoltages or resulting over currents from the signal output 2.

If negative voltages occur at the signal output 2, for example due to a short circuit, the separation circuit 130 will connect the control terminal 3 to the reference potential terminal GND. Due to the negative voltage at the signal output 2, a current will flow from the reference potential terminal GND via the sensing circuit 132 to the signal output 2. The other transistor 131 will therefore also be controlled to a conducting state, thus actively connecting the reference potential terminal GND to the control terminal 3. In other words, the control terminal 3 acts as a current sink for the current through the transistor 131. The reference potential at the control terminal 3 will bring the first and the second transistor P1, P2 to a non-conducting or open state such that no current can flow from the signal output 2 to the signal input 1, thus preventing damage to the transistors P1, P2. The bulk terminals of the first and the second transistor P1, P2 are floating in this case.

If the coupling circuit is unpowered while the signal output 2 and the reference potential connection GND are connected, for example no clock signal is provided to the charge pump circuit 110. In this condition the gate control circuit 10 passively reacts to a negative or a positive voltage at the signal output.

For example, for a negative voltage at the signal output 2, the separation 130 will actively bring the first and the second transistor P1, P2 to a non-conducting state, thus avoiding a current flow through the transistors. Furthermore, the elements of the charge pump circuit 110 will not provide any negative potential to the control terminal 3 but the reference potential due to the unpowered state of the circuit, hence, also in this case the first and the second transistor P1, P2 are actively turned off.

For example, for a positive voltage at the signal output 2, the gate-source-voltage between signal output 2 and control terminal 3 may be higher than the threshold voltage of transistors P1, P2, thus bringing the transistors P1, P2 to an conducting state. However, as the driver transistor 22 connected to the signal input 1 usually comprises an anti-leakage resistor between its gate and the reference potential terminal GND, the driver transistor 22 will be turned off, thus preventing a current flow over transistors P1, P2.

The protection of the elements described on different modes of operation above is given by the fact that any parasitic diodes between source and bulk or drain and bulk of the used transistors cannot be forward biased, thus preventing any unwanted current flows.

The coupling circuit shown in FIG. 3 can also be used for other circuits which need a protected coupling at their signal outputs. In particular, the coupling circuit can be used with any circuit in CMOS technology.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A coupling circuit, comprising:
   a signal input;
   a signal output;
   a first and a second transistor, each of a p-channel field-effect transistor type, wherein a drain terminal of the first transistor is connected to the signal input, source terminals of the first and the second transistor are commonly connected to the signal output, bulk terminals of the first and the second transistor are commonly connected to a drain terminal of the second transistor, and a gate terminal of the first transistor is connected to a gate terminal of the second transistor; and
   a gate control circuit with a charge pump circuit which is configured to generate a negative potential, wherein the gate control circuit is configured to control a gate voltage at the gate terminals of the first and the second transistor based on the negative potential,
   wherein the gate control circuit comprises a separation circuit which is configured to actuate the first and the second transistor to a non-conducting state when a potential at the signal output falls below a reference potential.

2. The coupling circuit according to claim 1, wherein the gate control circuit further comprises a limitation circuit which is configured to control the gate voltage depending on a potential at the signal input such that a potential difference between the gate voltage and the potential at the signal input does not exceed a predetermined value.

3. The coupling circuit according to claim 2, wherein the limitation circuit comprises at least one diode element whose anode terminal is connected to the signal input and whose cathode terminal is connected to the gate terminals of the first and the second transistor.

4. The coupling circuit according to claim 1, wherein the separation circuit comprises a switching element connecting the gate terminals of the first and the second transistor to a reference potential terminal and comprises a sensing circuit for controlling the switching element depending on the potential at the signal output.

5. The coupling circuit according to claim 4, wherein the switching element comprises a transistor which is connected to a transistor of the sensing circuit in a current mirror fashion, the transistor of the sensing circuit being connected to the signal output via a first resistive element.

6. The coupling circuit according to claim 1, wherein the charge pump circuit comprises:
   a clock input for receiving a clock signal;
   a first charge store connected between the clock input and a connection terminal;
   a first diode element whose anode terminal is connected to the connection terminal and whose cathode terminal is connected to a reference potential terminal;
   a second charge store connected between the reference potential terminal and an output terminal of the charge pump circuit for providing the negative potential; and
   a second diode element whose anode terminal is connected to the output terminal and whose cathode terminal is connected to the connection terminal.

7. The coupling circuit according to claim 6,
wherein the output terminal of the charge pump circuit is connected to the gate terminals of the first and the second transistor via a second resistive element.

8. A driver circuit comprising a coupling circuit according to claim 1, a driver transistor connected to the signal input of the coupling circuit, and a driver control circuit configured to control the driver transistor.

9. A method for controlling a coupling circuit, comprising:
providing a first and a second transistor, each of a p-channel field-effect transistor type, wherein a drain terminal of the first transistor is connected to a signal input, source terminals of the first and the second transistor are commonly connected to a signal output, bulk terminals of the first and the second transistor are commonly connected to a drain terminal of the second transistor, and a gate terminal of the first transistor is connected to a gate terminal of the second transistor;
generating a negative potential;
controlling a gate voltage at the gate terminals of the first and the second transistor, based on the negative potential;
sensing a potential at the signal output; and
actuating the first and the second transistor to a non-conducting state when the sensed potential falls below a reference potential.

10. The method according to claim 9, further comprising:
controlling the gate voltage depending on a potential at the signal input such that a potential difference between the gate voltage and the potential at the signal input does not exceed a predetermined value.

11. The method according to claim 9, wherein the gate terminals of the first and the second transistor are connected to a reference potential terminal in a controlled fashion depending on the sensed potential.

12. The method according to claim 9, wherein the negative potential is generated with a charge pump circuit.

13. The method according to claim 12, wherein the negative potential is provided to the gate terminals of the first and the second transistor via a resistive element.

* * * * *